(12) United States Patent  
Takeda et al.

(10) Patent No.: US 7,530,832 B2
(45) Date of Patent: May 12, 2009

(54) LASER LIGHT SOURCE DEVICE, DISPLAY DEVICE, SCANNING TYPE DISPLAY DEVICE, AND PROJECTOR

(75) Inventors: Takashi Takeda, Suwa (JP); Hiroshi Shingu, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 305 days.

(21) Appl. No.: 11/422,183

(22) Filed: Jun. 5, 2006

(65) Prior Publication Data
US 2007/0103643 A1    May 10, 2007

(30) Foreign Application Priority Data
Jun. 9, 2005 (JP) .............................. 2005-169401
May 31, 2006 (JP) .............................. 2006-151479

(51) Int. Cl.
*H01S 3/00* (2006.01)
*H01R 13/62* (2006.01)

(52) U.S. Cl. .................... 439/301; 372/109; 439/371
(58) Field of Classification Search ................ 439/301, 439/303, 371; 372/109
See application file for complete search history.

(56) References Cited

U.S. PATENT DOCUMENTS

| 4,003,048 | A | * | 1/1977 | Weise | 340/568.4 |
|---|---|---|---|---|---|
| 4,526,433 | A | * | 7/1985 | Tanaka | 439/301 |
| 4,676,572 | A | * | 6/1987 | Booker | 439/301 |
| 5,329,541 | A | * | 7/1994 | Brown | 372/88 |
| 6,291,795 | B1 | * | 9/2001 | Jones et al. | 219/121.63 |
| 2002/0016536 | A1 | * | 2/2002 | Benni | 600/323 |
| 2005/0162646 | A1 | * | 7/2005 | Tedesco et al. | 356/301 |
| 2007/0053117 | A1 | * | 3/2007 | Harter | 361/42 |
| 2007/0059225 | A1 | * | 3/2007 | Willette | 422/186.3 |
| 2007/0139921 | A1 | * | 6/2007 | Wu | 362/240 |
| 2007/0199243 | A1 | * | 8/2007 | Youn | 49/49 |

FOREIGN PATENT DOCUMENTS

JP    A 2001-267670    9/2001

* cited by examiner

*Primary Examiner*—Marcia A. Golub
(74) *Attorney, Agent, or Firm*—Oliff & Berridge, PLC

(57) ABSTRACT

To provide a laser light source unit, a display device, a scanning display device and a projector, in each of which, when a laser is taken out of the chassis or the like, a laser thereof is assuredly rendered incapable of emitting. The laser light source unit includes a laser light source portion 10 having a light oscillation portion 12 emitting light, a fixing member that fixes the laser light source portion 10, an interrupting means that, simultaneously with a movement of removing the laser light source portion 10 off the fixing member, interrupts a current path for supplying a current to the light oscillation portion 12 in the laser light source portion 10.

6 Claims, 4 Drawing Sheets

LASER LIGHT SOURCE DEVICE, DISPLAY DEVICE, SCANNING TYPE DISPLAY DEVICE, AND PROJECTOR

BACKGROUND

1. Technical Field

The present invention relates to a laser light source unit, a display device, a scanning display device and a projector.

2. Background Art

In recent years, there is a more and more stronger demand for a smaller projector. Under a situation in that a semiconductor laser is made higher in the output and a blue-emitting semiconductor laser is developed, a projector or a display that uses a laser light source is under study. These, since a wavelength range of the light source is very narrow, can greatly expand a color reproduction range, and, since miniaturization in and a reduction of constituent elements can be realized, are greatly expected as a potential next generation display device.

The laser light source, when operated with a safety device thereof removed, can damage a human body, in particular, an eye. Furthermore, it is considered that a laser light source provided to a display device is removed thereof and used in a weapon. As a countermeasure for this, a laser device where when a laser resonator (laser light source portion) is taken out of the laser device to replace and so on, a laser oscillation from the removed laser resonator is stopped is devised (e.g., see Patent Document 1).

Patent Document 1 JP-A-2001-267670

SUMMARY

However, a safety device such as an interlock unit disposed to a laser unit is disposed only to inhibit an accident due to the carelessness in the use from occurring. Accordingly, such a safety device cannot inhibit for someone to intentionally take a laser resonator portion off a chassis of the laser unit to use the laser resonator in other use.

Furthermore, in the technology described in the patent document 1, when the laser resonator is taken out of the chassis, a resonation structure of the laser is destroyed. Accordingly, it is practically difficult to apply to one that is difficult to destroy mechanically like a semiconductor laser and an increase in a manufacturing cost is caused as well.

Still furthermore, in the technology described in the patent document 1, a mirror is adhered to the chassis. Accordingly, owing to a variation in an environment such as a temperature, the mirror is displaced and thereby a resonant state may be varied. Furthermore, in a structure where a scanning mirror is destroyed in the technology described in the patent document 1, even when a scanning mirror is destroyed, the laser light source portion may be ill-used.

The present invention is to focus on the above-mentioned problems, and an object is to provide a laser light source unit, a display device, a scanning display device and a projector, in each of which, when a laser light source portion is taken out of the chassis or the like, a laser light source portion thereof is assuredly rendered incapable of emitting.

Furthermore, another object of some aspects of the invention is to provide a laser light source unit, a display device, a scanning display device and a projector, in each of which, when a laser light source portion is taken out of the chassis or the like, while a laser light source portion thereof is assuredly rendered incapable of emitting, an increase in the production cost and deterioration of performance can be suppressed low.

Means for Solving the Problems

In order to achieve the above objects, a laser light source unit according to the invention includes a laser light source portion having a light oscillation portion emitting light, a supporting portion that supports the laser light source portion, a fixing member that fixes the laser light source portion to the supporting portion, and an interrupting unit that, simultaneously with a movement of releasing a fixed state of the laser light source portion by the fixing member when removing the laser light source portion from the supporting portion, interrupts a current path for supplying a current to the light oscillation portion in the laser light source portion.

According to the invention, when the fixed state of the laser light source portion by the fixing member is released so as to take the laser light source portion off the supporting portion such as a chassis, since the interrupting unit interrupts a current path of the laser light source portion simultaneously with the movement, the laser light source portion can be assuredly rendered incapable of emitting. Accordingly, the laser light source portion can be forestalled from being removed from a display device and being ill-used. Furthermore, in the invention, a position that is interrupted by the interrupting unit is not a resonance structure of the laser light source portion. Accordingly, while avoiding deterioration of the performance of the laser light source portion and an increase in the manufacturing cost, the laser light source portion can be forestalled from being removed from a display device to be ill-used.

Furthermore, the laser light source unit according to the invention can be in a configuration that the laser light source portion has a substrate provided with the light oscillation portion, and the fixing member is formed with a screw that fixes the substrate to the supporting portion.

According to the invention, for example, the light oscillation portion such as a semiconductor laser is formed on a substrate and the substrate can be applied to a unit where the substrate is fixed to the supporting portion such as the chassis with a screw. When the screw is loosened to remove the substrate from the chassis, a current path of the semiconductor laser can be interrupted.

Still furthermore, the laser light source unit according to the invention can be in a configuration that the interrupting means formed with a cutting member that, simultaneously with a movement of releasing a fixed state of the laser light source portion, cuts or destroys a part of the current path.

According to the invention, when the fixed state of the laser light source portion is released so as to take the laser light source portion off the supporting portion (such as a chassis), a part of the current path is cut or destroyed by the cutting member so that the laser light source portion is assuredly rendered incapable of emitting. For example, a bonding wire is cut so that the laser is assuredly rendered incapable of emitting. The bonding wire is a metal wire having a diameter of 100 mm, for example. Accordingly, the bonding wire can be cut with a very slight force. As a result, the invention, while avoiding the performance of the laser light source portion from deteriorating and the manufacturing cost from increasing, can forestall the laser light source portion from being taken out and ill-used.

Furthermore, for example, the cutting member can be in a configuration so as to, simultaneously with a movement of removing the laser light source portion from the fixing member, cut or destroy a cathode electrode or an anode electrode of the laser light source portion. Accordingly, the invention, being a configuration that enables to destroy a current path without affecting on a resonation structure of the laser light source portion, while avoiding the performance of the laser light source portion from deteriorating and the manufacturing cost from increasing, can forestall the laser light source portion from being removed and ill-used.

Still furthermore, the laser light source unit according to the invention can be in a configuration that the cutting member made of an adhesive formed continuously adhered on at least a part or an entirety of the fixing member and a part or an entirety of the current path.

According to the invention, for instance, at least a part of the current path (the bonding wire) and the fixing member (screw or the like) can be formed fixed with an adhesive. When, in order to remove the laser light source portion from the supporting portion (a chassis or the like), the adhesive is removed to remove the fixing member from the supporting portion, the bonding wire fixed to the adhesive is assuredly cut. Accordingly, the invention, while avoiding the performance of the laser light source portion from deteriorating and the manufacturing cost from increasing, can forestall the laser light source portion from being removed and ill-used.

Furthermore, it is preferable that in the laser light source unit according to the invention the adhesive is a block of adhesive adhered to at least the screw that constitutes the fixing member and the bonding wire that constitutes a part of the current path.

According to the invention, when the block of adhesive is peeled off the screw to loosen the screw that is the fixing member, a portion adhering to the bonding wire in the block of adhesive is moved and thereby the bonding wire is assuredly cut. Accordingly, the invention, while avoiding the performance of the laser light source portion from deteriorating and the manufacturing cost from increasing, can forestall the laser light source portion from being removed and ill-used. When the adhesive is constituted of one that is discharged from a so-called liquid dispenser, the manufacturing cost can be further reduced.

Still furthermore, it is preferable that in the laser light source unit according to the invention the cutting member is a hook-like member attached to the fixing member and the hook-like member cuts the member that is the current path simultaneously with a movement for releasing a fixed state of the laser light source portion.

According to the invention, for example, a configuration where the hook-like member is disposed in the proximity of a member forming the current path and, when the fixing member is moved, the hook-like member is also moved to hook and cut the member forming the current path can be formed. Accordingly, the invention, while avoiding the performance of the laser light source portion from deteriorating and the manufacturing cost from increasing, can forestall the laser light source portion from being removed and ill-used.

Furthermore, it is preferable that in the laser light source unit according to the invention the hook-like member is connected to the screw that constitutes the fixing member or integrally formed with the screw and rotates simultaneously with a rotation of the screw, and in a rotation region of the hook-like member a part or an entirety of the bonding wire that constitutes the part of the current path is disposed.

According to the invention, the hook-like member is connected or integrally formed with the screw that is the fixing member. When the screw is rotated to remove the laser light source portion, the hook-like member is also rotated. At this time, since a part or an entirety of the bonding wire is disposed in a rotation region of the hook-like member, the hook-like member hook and cut the bonding wire. Accordingly, the invention, while avoiding the performance of the laser light source portion from deteriorating and the manufacturing cost from increasing, can forestall the laser light source portion from being removed and ill-used.

Still furthermore, the laser light source unit according to the invention can be in a configuration that the cutting member is a member including a throughhole and provided to the fixing member, the current path goes through the throughhole, and the member that includes the throughhole, simultaneously with a movement of releasing the laser light source portion from the supporting portion, cuts a member forming the current path.

Furthermore, it is preferable that in the laser light source unit according to the invention a portion that goes through the throughhole in the current path is a bonding wire.

According to the invention, a configuration where when the fixing member is moved to remove for instance the laser light source portion from the supporting portion (the chassis or the like), a position of the throughhole is also moved with the cutting member, and thereby a member forming the current path (the bonding wire or the like) is cut with a side face of the throughhole can be formed. Accordingly, the invention, while avoiding the performance of the laser light source portion from deteriorating and the manufacturing cost from increasing, can forestall the laser light source portion from being removed and ill-used.

Still furthermore, the laser light source unit according to the invention can be in a configuration that the cutting member has a spring and a cutting portion disposed in the vicinity of the bonding wire that constitutes the part of the current path, the spring is disposed so as to change a shape simultaneously with a movement of removing the laser light source portion from the supporting portion, and the cutting portion moves simultaneously with a change of shape of the spring to cut the bonding wire.

According to the invention, for instance, a configuration where the spring is fixed to the supporting portion (the chassis or the like) together with the laser light source portion with the fixing member (screw or the like) and the cutting portion is disposed in the vicinity of the bonding wire that constitutes a part of the current path can be formed. When the fixing member is moved to remove the laser light source portion from the supporting portion, the spring is deformed. Owing to the deformation, the cutting portion is moved to cut the bonding wire. Accordingly, the invention, while avoiding the performance of the laser light source portion from deteriorating and the manufacturing cost from increasing, can forestall the laser light source portion from being removed and ill-used.

According to a second aspect of the invention, a display device according to the invention includes the laser light source unit.

According to the invention, it can be forestalled that the laser light source portion attached to the display device from being removed, used to damage a human body and ill-used in a weapon.

According to a third aspect of the invention, a scanning display unit according to the invention includes a red light source, a green light source, a blue light source, a light combination portion that combines lights from light sources of the respective colors, and a scanning portion that scans a combined light to display an image, at least a light source of one color of the light source being formed of the laser light source unit.

According to the invention, the laser light source portion attached to the scanning display unit can be forestalled from being removed, damaging a human body and being ill-used in a weapon.

According to a fourth aspect of the invention, a projector according to the invention includes a light modulator that modulates light from the laser light source unit, and a projector that projects light modulated by the light modulator.

According to the invention, the laser light source portion attached to the projector can be forestalled from being removed, damaging a human body and being ill-used in a weapon.

DETAILED DESCRIPTION OF EMBODIMENTS

In what follows, embodiments according to the invention will be described with reference to the drawings. In the respective drawings that are referenced below, for convenience of excellent visibility, a magnification of the respective constitution elements is appropriately varied.

First Embodiment

Figure 1:
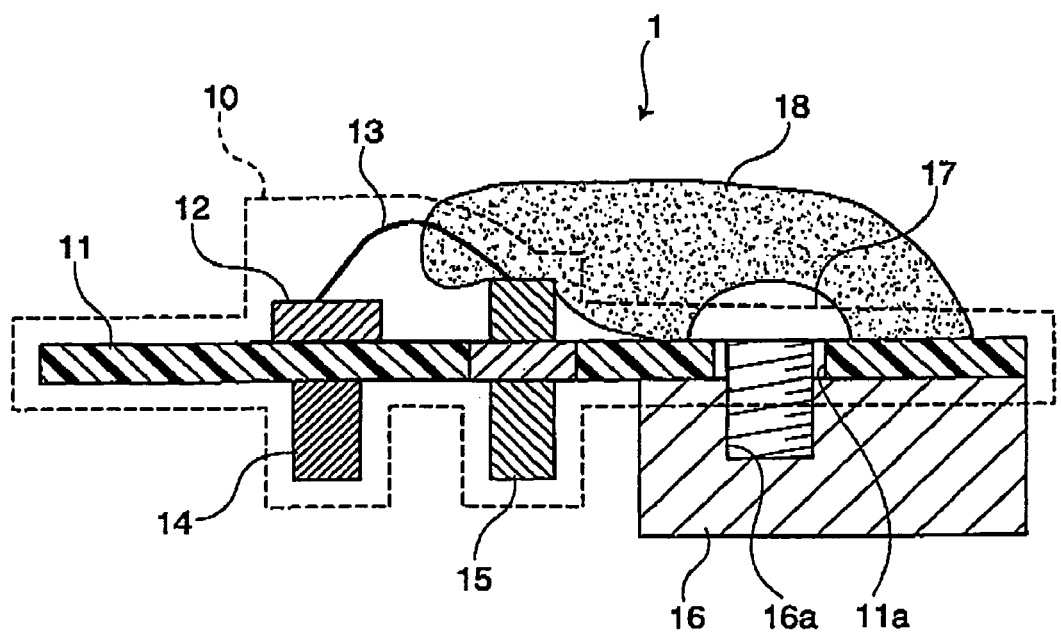
FIG. 1 is a schematic sectional view showing an example of a laser light source unit involving a first embodiment according to the invention.

FIG. 1 is a schematic sectional view showing an example of a laser light source unit involving a first embodiment according to the invention. A laser light source unit 1 according to the embodiment is a device that forms a light source of for instance a display device, a light communication unit, an audio device and an information processor. The laser light source unit 1 is constituted with a laser light source portion 10, a chassis 16 (supporting portion), a screw 17 (fixing member) and an adhesive 18 (interrupting means, cutting member).

Furthermore, the laser light source portion 10 is constituted with a substrate 11, a light oscillation portion 12, a bonding wire 13, an anode electrode 14 and a cathode electrode 15.

The substrate 11 is a planar member made of a semiconductor or an insulator such as glass. On the substrate 11, a circuit that drives and controls the light oscillation portion 12 or other circuits and a wiring may be formed. As the light oscillation portion 12, for instance, a semiconductor laser can be applied. The light oscillation portion 12 may be a side-emitting semiconductor laser or a surface-emitting laser. Furthermore, a laser having a configuration where a liquid or a gas is used as a laser medium and the laser medium is disposed between two mirrors may be used as the light oscillation portion 12. The light oscillation portion 12 according to the embodiment, like a semiconductor laser that is formed by applying a semiconductor process to the substrate 11, may be integrally formed with the substrate 11. Still furthermore, a semiconductor laser formed on a certain semiconductor substrate, after peeling off the semiconductor substrate, may be adhered to the semiconductor substrate 11.

The anode electrode 14 is an electrode electrically connected to an anode of the light oscillation portion 12 and attached to the substrate 11. The cathode electrode 15 is an electrode electrically connected to a cathode of the light oscillation portion 12 and attached to the substrate 11. The anode electrode 14 and the cathode electrode 15 are electrically isolated.

The bonding wire 13 is a thin wire made of Au or Al. A wire diameter of the bonding wire 13 can be formed for instance in the range of several tens mm to several hundreds mm. One end of the bonding wire 13 is connected to the cathode of the light oscillation portion 12 and the other end of the bonding wire 13 is connected to the cathode electrode 15. Such a connection of the bonding wire 13 necessitates using an expensive manufacturing device called a bonding machine. The bonding machine uses for instance ultrasonic and heat in combination to pressure to bond the bonding wire 13. The bonding wire 13, the anode electrode 14 and the cathode electrode 15 form a current path that supplies a current to the light oscillation portion 12.

The chassis 16 forms a part or an entirety of a supporting portion that supports the laser light source portion 10. For instance, the chassis 16 forms the supporting portion that supports the laser light source portion 10 and is a case that accommodates various members of a projector. Furthermore, the supporting portion may be own optical engine of the projector, for example, and may not be the chassis 16. In this embodiment, a screw hole 16a is formed in an upper surface of the chassis 16, and in the laser light source portion 10, a throughhole 11a is formed in substrate 11 on which the light oscillation portion 12 is provided. The substrate 11 is mounted on the upper surface of the chassis 16 such that the position of the screw hole 16a corresponds to the position of the throughhole 11a, and the screw 17 is inserted into the screw hole 16a from a surface of the substrate 11 where the light oscillation portion 12 is formed via the throughhole 11a of the substrate 11 to be screw-fixed. Whereby, the screw 17 fixes the laser light source portion 10 to the chassis 16 at a portion of the substrate 11. Also, the laser light source portion 10 can be detached from the chassis 16 by removing the screw 17 in a state before the adhesive 18 is coated. Accordingly, the chassis 16 functions as a supporting portion that supports the laser light source portion 10, and the screw 17 functions as a fixing member that fixes the laser light source portion 10 to the chassis 16.

The adhesive 18, as shown in FIG. 1, is continuously (in one block) attached so as to cover part of the bonding wire 13 and the screw 17. As the adhesive 18, any one of organic adhesives and inorganic adhesives may be used. However, the adhesive 18 preferably has the insulating properties. The adhesive 18 constitutes an interrupting unit that, simultaneously with a movement of removing the laser light source portion 10 off the chassis 16, interrupts a current path for supplying a current to the light oscillation portion 12 in the laser light source portion 10. In other words, the adhesive 18 constitutes a cutting member that, simultaneously with a movement of removing the laser light source portion 10 off the chassis 16, cuts the bonding wire 13 that is a part of the current path.

That is, in order to take the substrate 11 off the chassis 16 to remove the laser light source portion 10 from the chassis 16, the screw 17 is necessarily loosened. In order to loosen the screw 17, from above the screw 17, the adhesive 18 is necessarily peeled. When the adhesive 18 is peeled off above the screw 17, since the adhesive 18 is adhered as well to the bonding wire 13, the bonding wire 13 is cut. The bonding wire 13 is a very thin wire as mentioned above and a conductive wire very easy to cut. Accordingly, it is very difficult to take the laser light source portion 10 off the chassis 16 without cutting the bonding wire 13.

Furthermore, the laser light source portion 10 of which bonding wire 13 is cut cannot be operated unless another bonding wire is connected to the light oscillation portion 12 and the anode. In order to connect the bonding wire, a bonding machine expensive as mentioned above is necessary. Accordingly, the reuse of the laser light source portion 10 of which bonding wire 13 is cut is practically substantially impossible.

From these, the laser light source unit 1 according to the embodiment, simultaneously with a movement of removing the laser light source portion 10, can cut a position other than a resonation structure of the light oscillation portion 12. Accordingly, while avoiding the performance of the laser light source portion 12 from deteriorating and the manufacturing cost from increasing, the laser light source portion 10 can be forestalled from being removed and ill-used.

Furthermore, the laser light source unit I according to the embodiment may be constituted so that when the adhesive 18 is peeled off above the screw 17 the cathode electrode 15 (or anode electrode 14) is cut or destroyed. Even in such a configuration, simultaneously with a movement of removing the laser light source portion 10, the current path can be cut. Accordingly, while avoiding the performance of the light oscillation portion 12 from deteriorating and the manufacturing cost from increasing, the laser light source portion 10 can be forestalled from being removed and ill-used.

Second Embodiment

Figure 2:
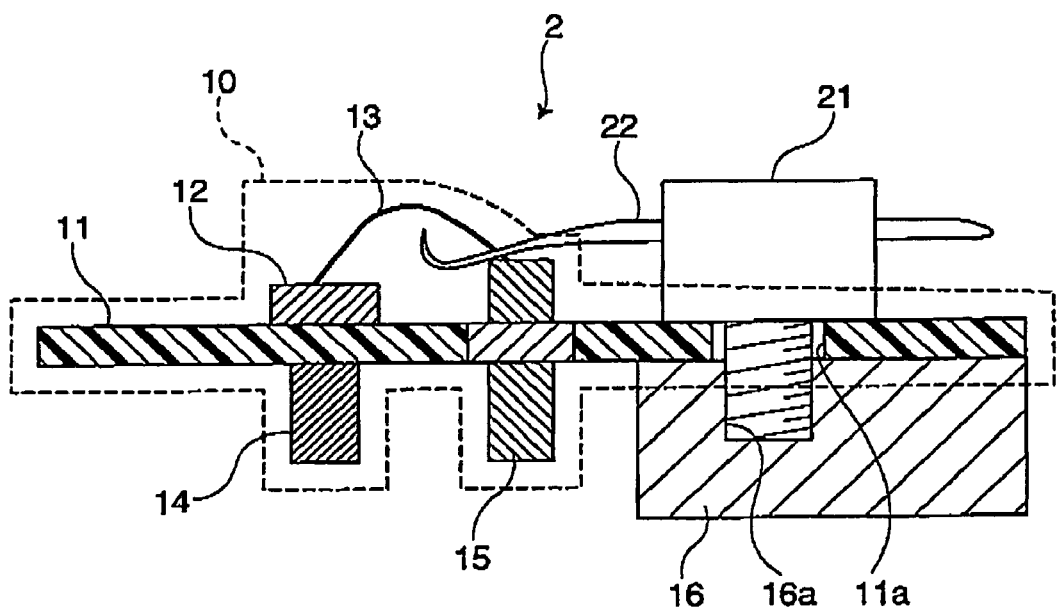
FIG. 2 is a schematic sectional view showing an example of a laser light source unit involving a second embodiment according to the invention.

FIG. 2 is a schematic sectional view showing an example of a laser light source unit involving a second embodiment according to the invention. In FIG. 2, elements like that of FIG. 1 are provided with like reference numerals and marks. Points different from the laser light source unit 1 according to the first embodiment in a laser light source unit 2 according to the embodiment are a fixing portion 21 and a hook 22.

The fixing portion 21 (fixing member) may be one that has a function same as the screw 17 in FIG. 1. There are similar points to the FIG. 1 that the screw hole 16a is provided on the chassis 16, the throughhole 11a is provided to the substrate 11, and that the fixing portion 21 is inserted in the screw hole 16a via the throughhole 11a. That is, the fixing portion 21 has a function of fixing the laser light source portion 10 at a part of the substrate 11 to the chassis 16 (supporting portion). However, to the fixing portion 21, the hook 22 (interrupting means, cutting member) is integrally or separately attached. The hook 22 is a member of which tip end is bent, preferably formed of a solid body such as metal, but may be formed of a resin or wood. That is, the hook 22 may be one that has the strength and a shape to an extent that can hook and cut the bonding wire 13.

The hook 22 rotates as the fixing portion 21 rotates. In a rotation region of the hook 22, the bonding wire 13 is partially disposed. Furthermore, the hook 22 moves as the fixing portion 21 moves and in a movement region of the hook 22, the bonding wire 13 may be partially disposed.

From these, in the laser light source unit 2 according to the embodiment, simultaneously with a movement of rotating the fixing portion 21 when removing the laser light source portion 10 from the chassis 16, the hook 22 can hook and cut the bonding wire 13. Accordingly, the laser light source unit 2, while avoiding the performance of the light oscillation portion 12 from deteriorating and the manufacturing cost from increasing, can forestall the laser light source portion 10 from being removed and ill-used.

Third Embodiment

Figure 3:
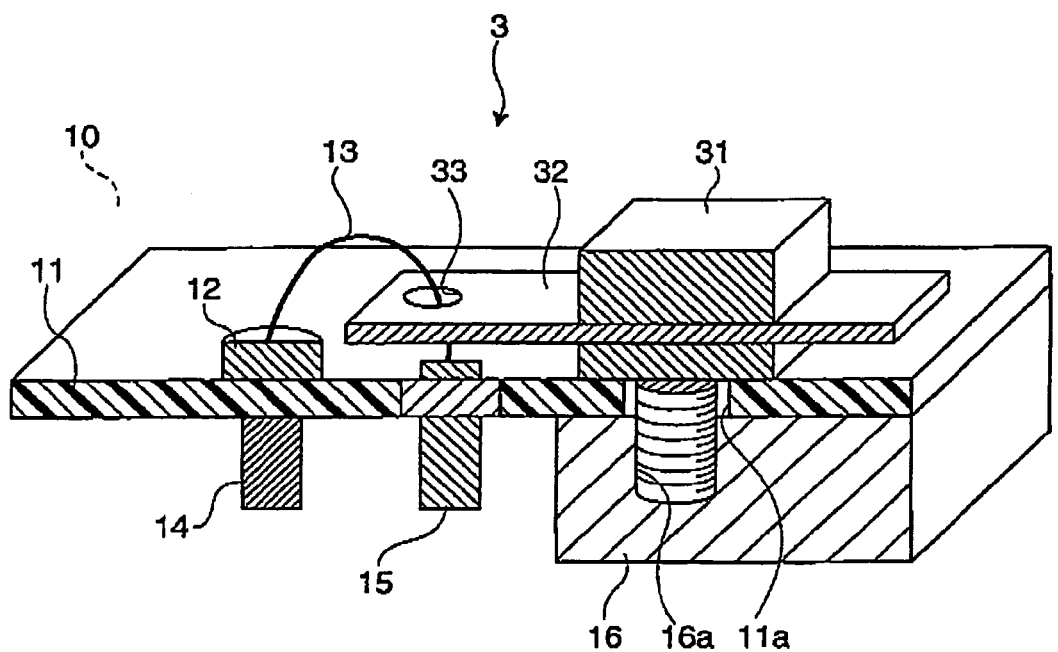
FIG. 3 is a schematic perspective view showing an example of a laser light source unit involving a third embodiment according to the invention.

FIG. 3 is a schematic perspective view showing an example of a laser light source unit involving a third embodiment according to the invention. In FIG. 3, elements same as that of FIG. 1 are provided with like reference numerals and marks. Points different from the laser light source unit 1 according to the first embodiment in a laser light source unit 3 according to the embodiment are a fixing portion 31 and a cutting portion 32. The cutting portion 32 is provided with a throughhole 33.

The fixing portion 31 (fixing member) may be one that has a function same as the screw 17 in FIG. 1. There are similar points to the FIG. 1 that the screw hole 16a is provided on the chassis 16, the throughhole 11a is provided to the substrate 11, and that the fixing portion 21 is inserted in the screw hole 16a via the throughhole 11a. That is, the fixing portion 31 has a function of fixing the laser light source portion 10 at a part of the substrate 11 to the chassis 16 (supporting portion). However, to the fixing portion 31, the plate-like cutting portion 32 (interrupting means, cutting member) which corresponds to a head of the screw is integrally or separately attached. Furthermore, as shown in FIG. 3, the throughhole 33 is provided on a side of the end portions of the cathode electrode 15 and the anode electrode 14 for the cutting porting 32, and the bonding wire 13 is formed penetrated through the throughhole 33 of the cutting portion 32.

From these, in the laser light source unit 3 according to the embodiment, simultaneously with a movement of rotating the fixing portion 31 when removing the laser light source portion 10 from the chassis 16, the cutting portion 32 is rotated, accordingly a position of the throughhole 33 is moved and a side surface of the throughhole 33 of the cutting portion 32 can cut the bonding wire 13. Accordingly, the laser light source unit 3, while avoiding the performance of the light oscillation portion 12 from deteriorating and the manufacturing cost from increasing, can forestall the laser light source portion 10 from being removed and ill-used.

Fourth Embodiment

Figure 4A:
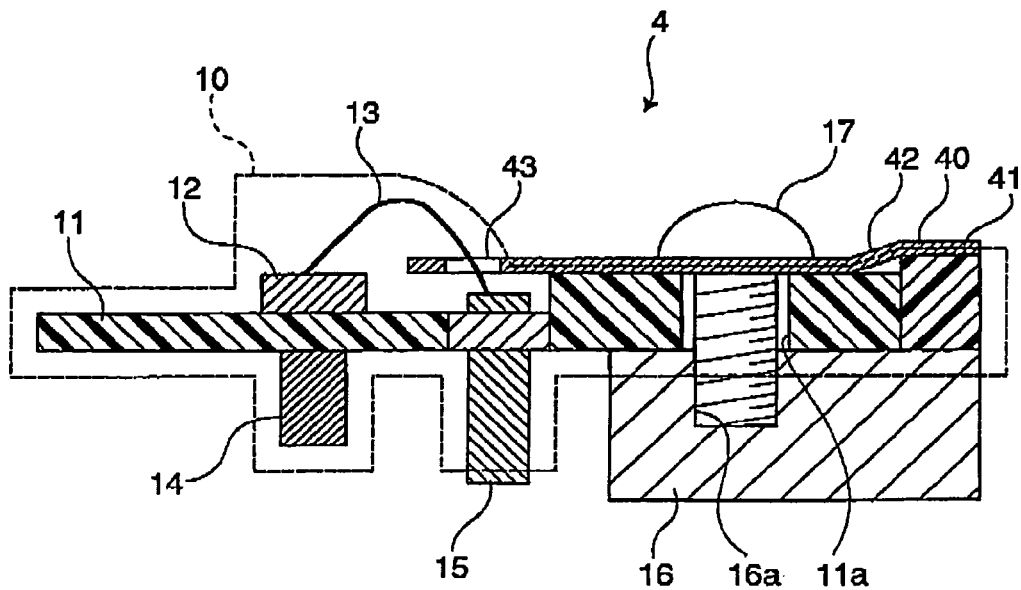
FIG. 4 is a diagram showing an example of a laser light source unit involving a fourth embodiment according to the invention.
Figure 4B:
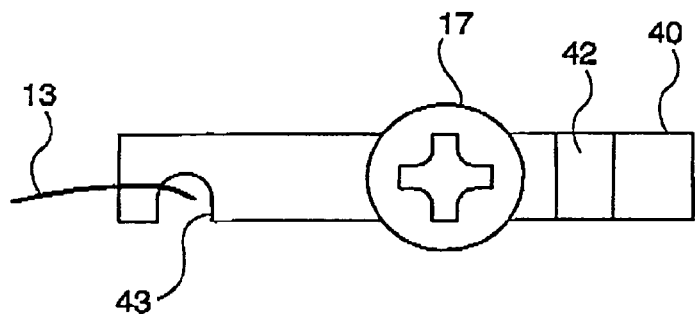

FIG. 4 is a diagram showing an example of a laser light source unit 4 involving a fourth embodiment according to the invention. FIG. 4(a) is a schematic sectional view of the laser light source unit 4. FIG. 4(b) is a plan view showing a portion of a part of the bonding wire 13, the screw 17 and an interrupting member 40 in FIG. 4(a). In FIGS. 4(a) and 4(b), elements like that of FIG. 1 are provided with like reference numerals and marks. A point different from the laser light source unit 1 according to the first embodiment in a laser light source unit 4 according to the embodiment is an interrupting member 40.

The interrupting member 40 (interrupting means, cutting member) is a sheet of planar member having a connecting portion 41, a spring 42 and a cutting portion 43. The planar member that forms the interrupting member 40 is preferably formed of one high in the elasticity such as a metal. The connecting portion 41 is a portion that is connected to or in contact with the substrate 11. The spring 42 is a reversibly deformable portion. The cutting portion 43 is a portion disposed in the vicinity of the bonding wire 13. In addition, a throughhole is provided between the spring 42 and the cutting portion 43 of the interrupting member 40. In this embodiment, a screw hole 16a is cut on the chassis 16, and a throughhole 11a is formed on the substrate 11 of laser light source unit 10. Further, a substrate 11 is mounted on the chassis 16 so as to match a position of the throughhole 11a with a position of the screw hole 16a, a screw 17 is inserted in the screw hole 16a through a throughhole of the interrupting member 40 and a throughhole 11a of the substrate 11 from the upper side of the interrupting member 40 so as to be screwed. In the open state in which the screw is not screwed, the interrupting member 40 becomes a flat-shape in a horizontal direction from a height of the connecting portion 41. However, in the closed state in which the screw is screwed, the interrupting member 40 is elastically transformed in the portion of the spring 42 and is fixed in a state that is pushed on the substrate 11 by screw 17. Accordingly, the cutting portion 43 is disposed so as to hook and cut the bonding wire 13 when a position of the cutting portion 43 is moved from this state. A shape of the cutting portion 43 may be, other than a shape like a hook shown in FIG. 4(b), a shape such as a throughhole 33 of the cutting portion 32 shown in FIG. 3. When it is formed in a shape of a throughhole, the bonding wire 13 is disposed so as to go through the throughhole.

From these, in the laser light source unit 4 according to the embodiment, when the screw 17 is loosened to take the laser light source portion 10 off the chassis 16, the spring 42 of the interrupting member 40 is elastically returned. Then, the interrupting member 40 moves so as to rotate with the connecting portion 41 as a fulcrum and the cutting portion 32 moves upward in the drawing. Owing to the movement of the cutting portion 32, an edge of the cutting portion 32 hooks and cuts the bonding wire 13. Accordingly, the laser light source unit 4, while avoiding the performance of the light oscillation portion 12 from deteriorating and the manufacturing cost from increasing, can forestall the laser light source portion 10 from being removed and ill-used.

Display Device

In the next place, one embodiment of a display device that uses any one of the laser light source units 1 through 4 will be described.

Figure 5:
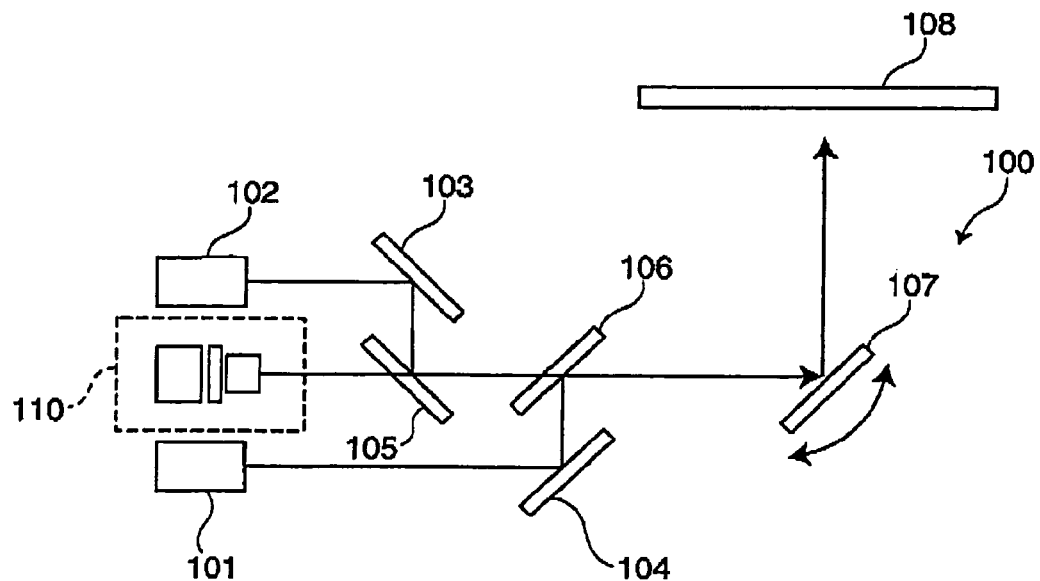
FIG. 5 is a block diagram showing an example of a scanning display unit involving an embodiment according to the invention.

FIG. 5 is a block diagram showing a schematic configuration of a full-color scanning display unit 100 that is a display device according to the embodiment. The scanning display unit 100 includes a light source formed of a red light source 102, a green light source 110 and a blue light source 101, a reflector plate 103 reflecting red light, a reflector plate 104 reflecting blue light, a dichroic mirror 105 transmitting green light and reflecting red light, a dichroic mirror 106 transmitting green light and reflecting blue light, a scanning mirror 107 scanning a light source light and a display plate 108 displaying light from the scanning mirror 107 as an image.

Each of the red light source 102, the green light source 110 and the blue light source 101 is made of any one of the laser light source units 1 through 4 respectively shown in FIGS. I through 4.

Red light emitted from the red light source 102, after reflection with the reflector plate 103 and the dichroic mirror 105, transmits further the dichroic mirror 106 and is lead to the scanning mirror 107. Furthermore, blue light emitted from the blue light source 101, after reflection with the reflector plate 104 and the dichroic mirror 106, is lead to the scanning mirror 107. Still furthermore, green light emitted from the green light source 110, after transmission of the dichroic mirror 105 and the dichroic mirror 106, is lead to the scanning mirror 107. In the scanning mirror 107, in accordance with an image imaged on the display plate 108, the scanning is carried out.

According to the scanning display unit 100 according to the embodiment, the laser light source units 10 forming the red light source 102, the green light source 110 and the blue light source 101 can be forestalled from being removed to damage a human body and ill-used in a weapon.

Projector

In the next place, one embodiment of a projector that uses any one of the laser light source units 1 through 4 will be described.

Figure 6:
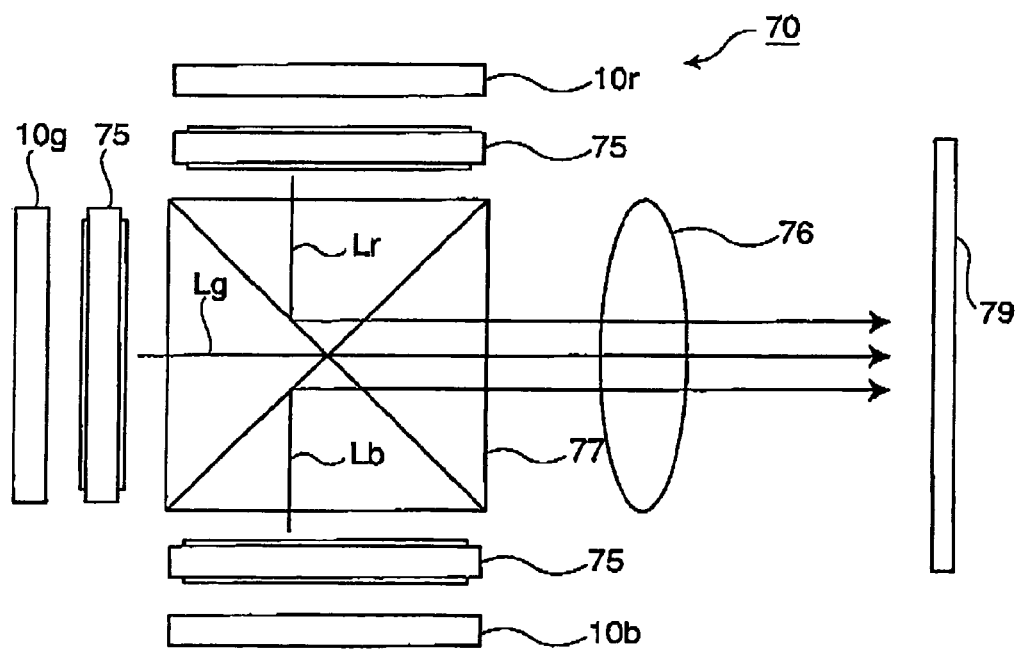
FIG. 6 is a schematic configuration diagram showing an example of a projector involving an embodiment according to the invention.

FIG. 6 is a diagram showing a schematic configuration of a projector 70 according to the embodiment, an example of a three-plate system. In the projector 70, three of an array light source 10r where semiconductor lasers emitting a color light of red (R) are arranged in a two-dimensional array, an array light source 10g emitting a color light of green (G) and an array light source 10b where semiconductor lasers emitting a color light of blue (B) are arranged in a two-dimensional array are used as a light source.

Each of the array light source 10r, array light sources 10g and array light sources 10b is made of any one of the laser light source units 1 through 4 respectively shown in Figs. 1 through 4.

Light emitted from each of the array light sources 10r, 10g and 10b is irradiated on a liquid crystal light bulb 75 (light modulator). That is, on an exit side of each of the array light sources 10r, 10g and 10b, a light crystal light bulb 75 that modulates each of color lights of R, G and B is disposed. Three color light modulated by the respective liquid crystal light bulbs 75 are configured so as to enter a cross dichroic prism (light combining unit) 77. The prism is formed by adhering four rectangular prisms and on each of internal surfaces a dielectric multi-layered film that reflects red light and a dielectric multi-layered film that reflects blue light are formed in cross. With the dielectric multi-layered films, three color lights Lr, Lg and Lb are combined to form a light expressing a color image. The combined light is projected on a screen 79 by use of a projection lens 76 (projector), and thereby an enlarged image is displayed.

In the above, a configuration where a transmissive liquid crystal light bulb is used is shown. However, a reflective liquid crystal light bulb can be used as well. Furthermore, a digital micro-mirror device can be used as well.

According to the projector 70 according to the embodiment, the laser light source units 10 forming the array light source 10r, array light source 10g and array light source 10b can be forestalled from being removed to damage a human body and ill-used in a weapon.

The technical range of the invention is not restricted to the embodiments, and various kinds of modifications can be applied within a range that does not deviate from a gist of the invention. For example, the above embodiment is described about a case that the various cutting member cuts the bonding wire which is a part of a current path. However, the cutting member may cut of destroy an electrode such as an anode electrode, a cathode electrode in stead of cutting the bonding wire. For example, a weak portion may be formed at a part of the electrode, and the cutting member strikes the weak portion and the electrode is destroy to interrupt the current path.

What is claimed is:

1. A laser light source unit, comprising:
a laser light source portion having a light oscillation portion emitting light;
a supporting portion that supports the laser light source portion;

a fixing member that fixes the laser light source portion to the supporting portion; and interrupting means that, simultaneously with a movement of releasing a fixed state of the laser light source portion by the fixing member when removing the laser light source portion from the supporting portion, interrupts a current path for supplying a current to the light oscillation portion in the laser light source portion, wherein the interrupting means includes a cutting member that, simultaneously with a movement of releasing a fixed state of the laser light source portion, cuts or destroys a part of the current path; and wherein the cutting member is made of an adhesive continuously adhered on at least a part of the fixing member and a part of the current path.

2. The laser light source unit according to claim 1, wherein the laser light source portion has a substrate provided with the light oscillation portion, and the fixing member comprises a screw that fixes the substrate to the supporting portion.

3. A laser light source unit, comprising:

a laser light source portion having a light oscillation portion emitting light;

a supporting portion that supports the laser light source portion;

a fixing member that fixes the laser light source portion to the supporting portion; and interrupting means that, simultaneously with a movement of releasing a fixed state of the laser light source portion by the fixing member when removing the laser light source portion from the supporting portion, interrupts a current path for supplying a current to the light oscillation portion in the laser light source portion, wherein the interrupting means includes a cutting member that, simultaneously with a movement of releasing a fixed state of the laser light source portion, cuts or destroys a part of the current path;

wherein the cutting member is made of an adhesive continuously adhered on at least a part or an entirety of the fixing member and a part or an entirety of the current path; and wherein the adhesive is a block of adhesive adhered to at least the screw that constitutes the fixing member and the bonding wire that constitutes a part of the current path.

4. A display device, comprising:
a laser light source unit according to claim 1.

5. A scanning display unit, comprising:
a red light source, a green light source, a blue light source, a light combination portion that combines lights from light sources of the respective colors, and a scanning portion that scans a combined light to display an image, wherein
a light source of at least one color of the light sources is formed of the laser light source unit according to claim 1.

6. A projector, comprising:
a laser light source unit according to claim 1;
a light modulator that modulates light from the laser light source unit; and
a projection unit that projects light modulated by the light modulator.

* * * * *